United States Patent
Sakata et al.

(10) Patent No.: US 8,110,497 B2
(45) Date of Patent: Feb. 7, 2012

(54) METHOD FOR MANUFACTURING SEMICONDUCTOR DEVICE

(75) Inventors: Atsuko Sakata, Yokohama (JP); Soichi Yamashita, Kawasaki (JP); Yasuyuki Sonoda, Tsukuba (JP); Hiroshi Toyoda, Kamakura (JP); Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 12/646,598

(22) Filed: Dec. 23, 2009

(65) Prior Publication Data
US 2010/0167529 A1 Jul. 1, 2010

(30) Foreign Application Priority Data

Dec. 26, 2008 (JP) ................. 2008-334976
Dec. 18, 2009 (JP) ................. 2009-287332

(51) Int. Cl.
*H01L 21/4763* (2006.01)
(52) U.S. Cl. ........ 438/638; 438/652; 438/678; 438/687; 257/E21.582
(58) Field of Classification Search .......... None
See application file for complete search history.

(56) References Cited

U.S. PATENT DOCUMENTS

| | | | |
|---|---|---|---|
| 5,824,599 A | 10/1998 | Schacham-Diamand et al. | |
| 6,946,387 B2 * | 9/2005 | Wada et al. | 438/629 |
| 7,507,659 B2 * | 3/2009 | Ohtsuka et al. | 438/643 |
| 7,994,055 B2 * | 8/2011 | Sakai et al. | 438/687 |
| 2007/0117377 A1 | 5/2007 | Yang et al. | |
| 2008/0113508 A1 | 5/2008 | Akolkar et al. | |
| 2008/0160762 A1 | 7/2008 | Feustel et al. | |

FOREIGN PATENT DOCUMENTS

JP 2007-150298 6/2007

* cited by examiner

*Primary Examiner* — Zandra Smith
*Assistant Examiner* — Khanh Duong
(74) *Attorney, Agent, or Firm* — Finnegan, Henderson, Farabow, Garrett & Dunner, L.L.P.

(57) ABSTRACT

An embodiment of the present invention provides a method for manufacturing a semiconductor device. This method comprises: forming a seed film at least on an inner face of a recessed portion of a substrate; forming a protection film on the seed film, the protection film being made of a material that is more easily oxidized than a material forming the seed film; heat-treating the protection film; exposing at least part of the seed film by removing at least part of the heat-treated protection film; forming a plating film on the seed film through electrolytic plating to be buried in the recessed portion, by supplying current to the seed film that is at least partially exposed; and removing the plating film except for a portion buried in the recessed portion.

20 Claims, 14 Drawing Sheets

METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2008-334976, filed on Dec. 26, 2008; and the prior Japanese Patent Application No. 2009-287332, filed on Dec. 18, 2009; the entire contents of which are incorporated herein by reference.

BACKGROUND OF THE INVENTION

1. Field of the Invention

The present invention relates to a method for manufacturing a semiconductor device.

2. Background Art

In recent years, the damascene process has been used to form the interconnects of semiconductor devices. According to the damascene process, recessed portions that are grooves or holes are formed in the surface of an insulating film in advance, and the recessed portions are filled with Cu. The unnecessary portions of Cu are then removed by chemical mechanical polishing (CMP), to form the interconnects.

To bury Cu according to the damascene process, a plating technique is normally used. In a case where Cu is buried in the recessed portions by electrolytic plating, a seed film is formed to supply current at the time of the electrolytic plating.

If the recessed portions are very fine, however, the seed film blocks the upper portions of the recessed portions, so that the plating solution does not reach sufficiently depth in the recessed portions. As a result, defects may be formed in the plating film. Therefore, thinner seed films are being developed.

A seed film is formed by processing performed in vacuum. However, being exposed to the atmosphere prior to electrolytic plating, the seed film might be oxidized by oxygen or moisture or the like existing in the atmosphere. The oxide formed through the oxidation is dissolved in a plating solution. Therefore, once a thinned seed film is oxidized, the resultant oxide is dissolved in a plating solution, so that the seed film disappears at some locations. As a result, defects are formed, and degradation of electrical reliability, such as defective via connections, might be caused.

A technique for forming a sacrifice seed film of Cu on a seed film containing Ru, Ir, or both Ru and Ir has been disclosed (see JP-A 2007-150298 (KOKAI), for example). This sacrifice seed film, however, is made of Cu or a Cu alloy. Therefore, oxygen permeates the sacrifice seed film, so that the seed film might be oxidized.

BRIEF SUMMARY OF THE INVENTION

An aspect of the present invention provides a method for manufacturing a semiconductor device, comprising: forming a seed film at least on an inner face of a recessed portion of a substrate; forming a protection film on the seed film, the protection film being made of a material that is more easily oxidized than a material forming the seed film; heat-treating the protection film; exposing at least part of the seed film by removing at least part of the heat-treated protection film; forming a plating film on the seed film through electrolytic plating to be buried in the recessed portion, by supplying current to the seed film that is at least partially exposed; and removing the plating film except for a portion buried in the recessed portion.

Another aspect of the present invention provides a method for manufacturing a semiconductor device, comprising: forming an alloy film at least on an inner face of a recessed portion of a substrate, the alloy film being formed with a first metal and at least one second metal that is more easily oxidized than the first metal; forming a seed film comprising the first metal and a protection film comprising an oxide of the second metal on the seed film, by heat-treating the alloy film; exposing at least part of the seed film by removing at least part of the protection film; forming a plating film on the seed film through electrolytic plating to be buried in the recessed portion, by supplying current to the seed film that is at least partially exposed; and removing a portion of the plating film except for a portion buried in the recessed portion.

DETAILED DESCRIPTION OF THE INVENTION

First Embodiment

Figure 1A:
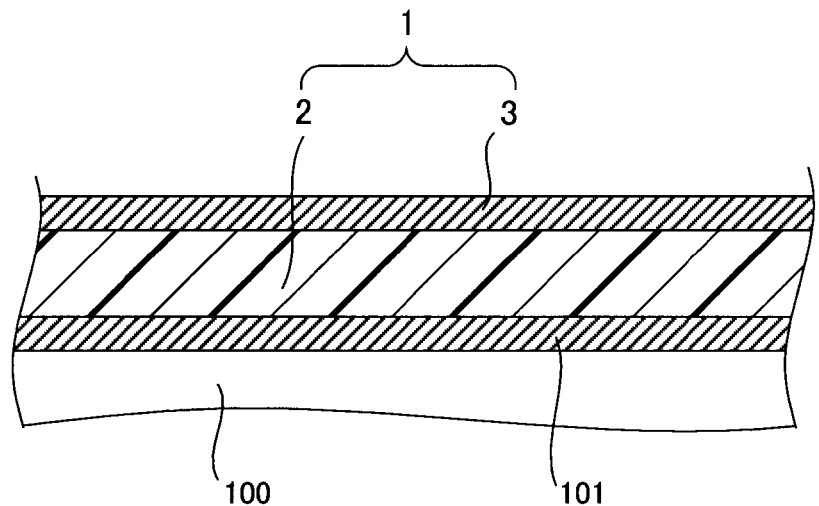
FIGS. 1A through 1C are schematic views illustrating procedures for manufacturing a semiconductor device according to a first embodiment.

The following is a description of a first embodiment of the present invention, with reference to the accompanying drawings. FIGS. 1A through 8 are schematic views illustrating the procedures for manufacturing a semiconductor device according to this embodiment. In the drawings, like components are denoted by like reference numerals.

As shown in FIG. 1A, an interlayer insulating film 1 is formed on a substrate 100 having a $SiO_2$ film 101 on its surface by chemical vapor deposition (CVD) or an a coating technique (step 1). A semiconductor element or the like (not shown) and a lower electrode (not shown) electrically connected to the semiconductor element or the like are formed in the substrate 100, and the lower electrode is exposed through the $SiO_2$ film 101.

Examples of the interlayer insulating film 1 include a low-dielectric constant insulating film such as an organiosilicon oxide film, an organic resin film or a porous Si oxide film, and a $SiO_2$ film. In this embodiment, the interlayer insulating film 1 is formed with a stack structure of a polyaryleneether film (PAE film) 2 and a $SiO_2$ film 3.

Figure 1B:
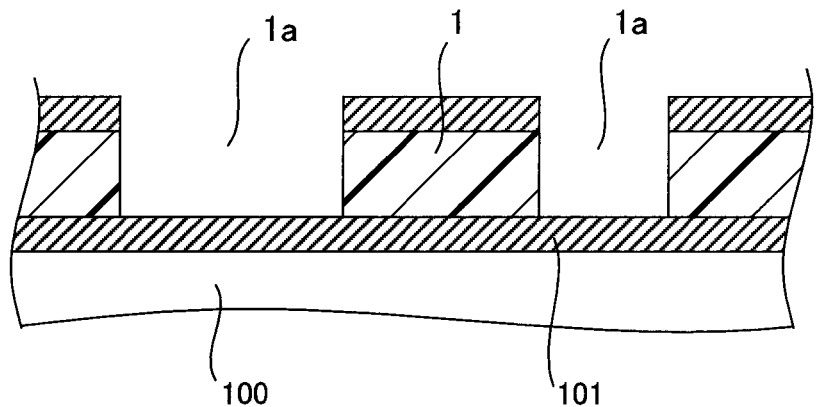

After the formation of the interlayer insulating film 1, recessed portions 1a are formed in the interlayer insulating film 1 by a photolithography technique and reactive ion etching (RIE), as shown in FIG. 1B (step 2). In this manner, a substrate having the recessed portions 1a in its surface is formed. The recessed portions 1a may be interconnect grooves, via holes, contact holes, or combinations of via holes and interconnect grooves. In this embodiment, the recessed portions is function as interconnect grooves, for example.

To form the recessed portions 1a, a resist pattern is first formed on the interlayer insulating film 1. With the resist pattern serving as a mask, the interlayer insulating film 1 is etched by RIE, to form the recessed portions 1a in the interlayer insulating film 1. After the recessed portions 1a are formed in the interlayer insulating film 1, the resist pattern is removed by ashing or the like.

Figure 1C:
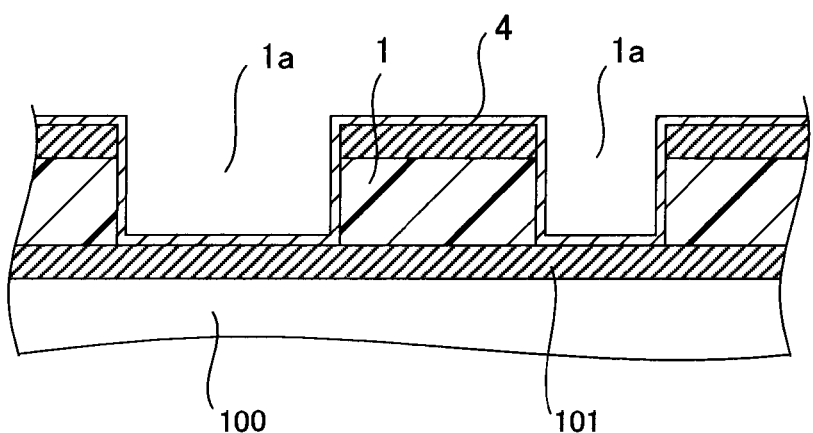

After the recessed portions 1a are formed in the interlayer insulating film 1, a barrier metal film 4 for suppressing metal diffusion into the interlayer insulating film 1 is formed on the interlayer insulating film 1 by sputtering or CVD, as shown in FIG. 1C (step 3). Examples of materials for forming the barrier metal film 4 include conductive materials such as Ta, Ti, TaN, TiN, NbN, WN, and VN. The barrier metal film 4 may be formed with a stack film formed with some of those materials.

Figure 2A:
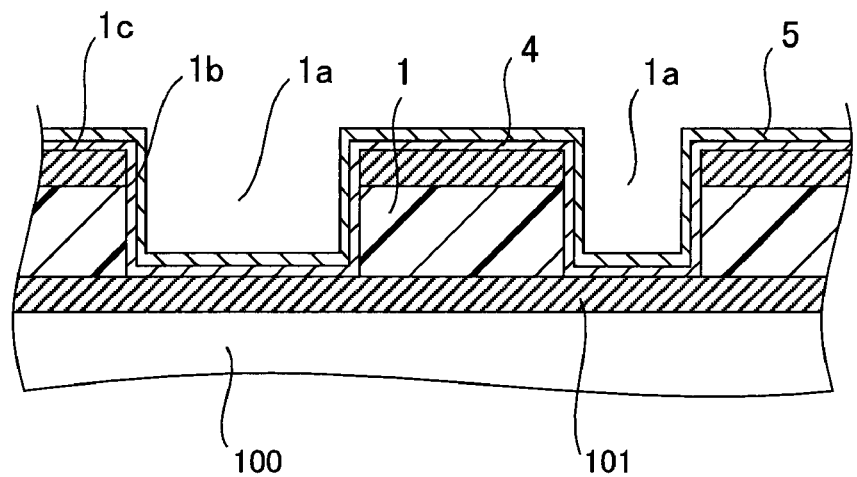
FIGS. 2A through 2C are schematic views illustrating procedures for manufacturing the semiconductor device according to the first embodiment.

After the barrier metal film 4 is formed on the interlayer insulating film 1, a seed film 5 for allowing current to pass at the time of electrolytic plating is formed on the barrier metal film 4 by sputtering or the like, as shown in FIG. 2A (step 4). The seed film 5 should be formed at least on the inner faces 1b of the recessed portions 1a. In this embodiment, however, the seed film 5 is formed not only on the inner faces 1b of the recessed portions 1a, but also on the field region 1c. The field region 1c is the surface portion of the interlayer insulating film 1 outside the recessed portions 1a. The seed film 5 may be made of Cu, for example.

Figure 2B:
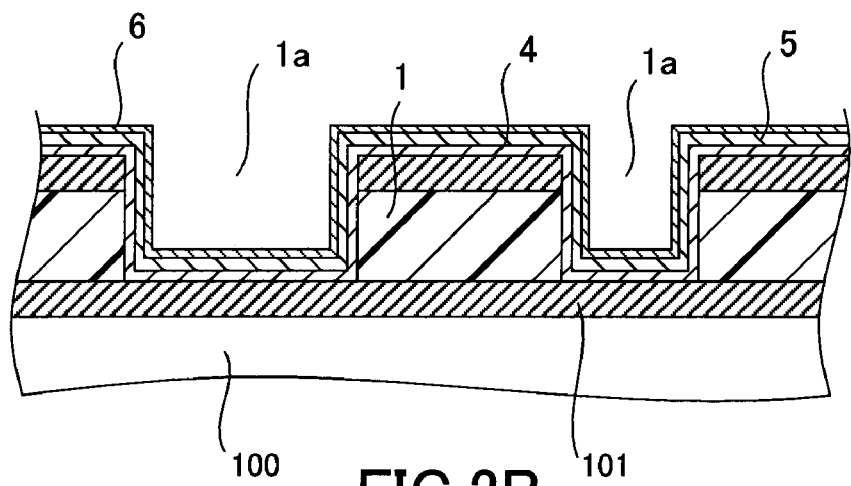

After the seed film 5 is formed on the barrier metal film 4, a protection film 6 for gettering the oxygen existing in the seed film 5 and in the surface is formed on the seed film 5 by physical vapor deposition (PVD), chemical vapor deposition (CVD), or atomic layer deposition (ALD), as shown in FIG. 2B (step 5).

The protection film 6 is made of a material that is more easily oxidized than the material forming the seed film 5. Whether a material can be more easily oxidized than the material of the seed film can be readily determined from an Ellingham diagram. In a case where the standard free energy of formation of an oxide $\Delta G^O = A + BT$ (kJ/mol) is plotted in an Ellingham diagram, oxidation is easier with a material having a smaller $\Delta G^O$, and a stable oxide is normally formed. With the temperature range used in a Cu interconnect formation process being set between room temperature and approximately 450° C., it can be considered that a material having the same $\Delta G^O$ gradient direction, that is, a B value with the same negative or positive sign and having a smaller value A can be more easily oxidized, and forms a stable oxide in the atmosphere or an oxidation atmosphere. More specifically, in the case of Cu, the A value is equal to or larger than −350 kJ. In the case of Co, Ni, Zn, V, Cr, W, Mn, Al, Nb, or Ti, the sign of the value B is the same as that in the case of Cu, and the value A is smaller than −350 kJ. As is apparent from this fact, Co and the likes are more easily oxidized than Cu, and form stable oxides. Accordingly, in a case where the seed film 5 is made of Cu, at least Co, Ni, Zn, V, Cr, W, Mn, Al, Nb, and Ti can be considered to be materials that are more easily oxidized than the material forming the seed film 5.

After the protection film 6 is formed on the seed film 5, the protection film 6 is heat-treated in vacuum, or in an atmosphere in the existence of an insert gas or a reduction gas such as Ar, $N_2$, $H_2$, or the like under reduced pressure or ordinary pressure, so that the protection film 6 getters the oxygen existing in the seed film 5 and in the surface (step 6). This heat treatment is carried out at such a temperature that the material forming the seed film 5 does not obviously react with the material forming the protection film 6.

Figure 2C:
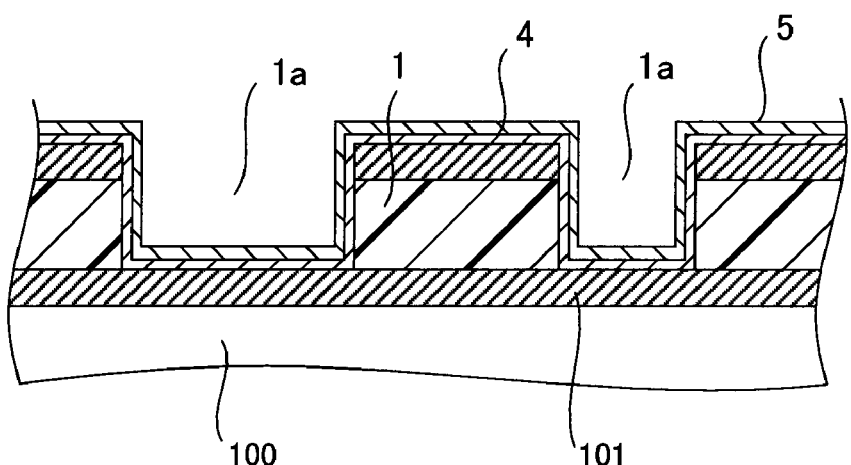

After the protection film 6 is heat-treated, at least part of the protection film 6 is removed, to expose at least part of the seed film 5, as shown in FIG. 2C (step 7). In this embodiment, the protection film 6 is dissolved in a plating solution used in the later described electrolytic plating procedure, to remove the protection film 6.

Figure 9:
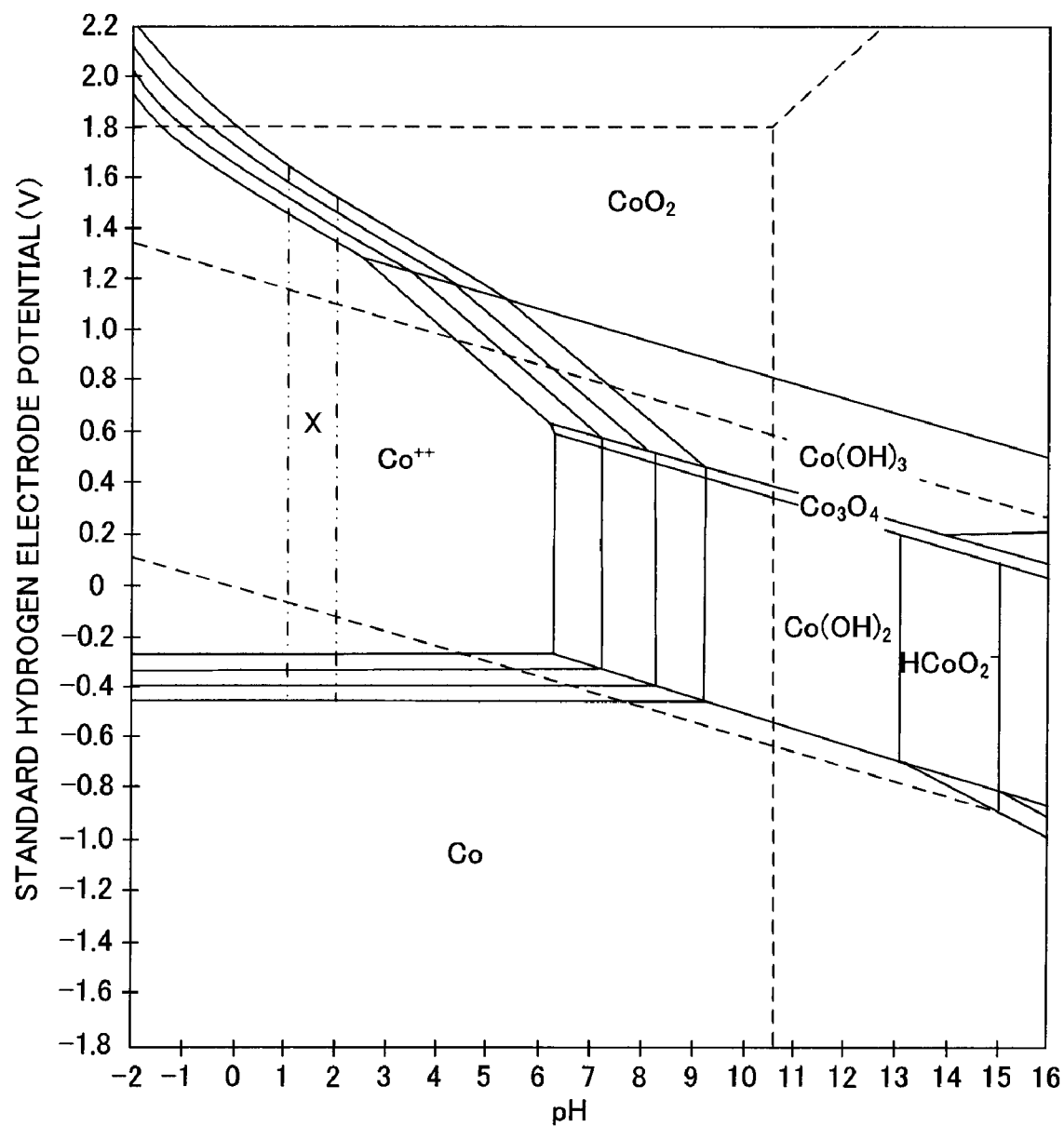
FIG. 9 is a potential-pH diagram in the case of Co.

When the protection film 6 is dissolved in the plating solution, the seed film 5 might also be dissolved. Therefore, dissolution of the seed film 5 needs to be suppressed by adjusting the potential conditions and the likes in the following manner. FIG. 9 is a potential-pH diagram in the case of Co. In FIG. 9, the horizontal axis indicates pH, and the vertical axis indicates the potential with respect to the standard hydrogen electrode. However, the relationship of redox and corrosion with each material is established even in the plating solution. According to FIG. 9, where a copper-sulfate-based solution is used as the plating solution, for example, Co is ionized (dissolved), as long as the potential is within the region X of approximately −0.47 V to 1.6 V with respect to a pH of 1 to 2, which is equivalent to the pH of the plating solution. This region X represents the region where Co and Co oxides can be dissolved. Meanwhile, in a potential-pH diagram in the case of Cu (not shown), a potential range of approximately −0.47 V to 0.1 V within the Co-dissolving region X (−0.47 V to 1.6 V) represents the range in which Cu does not dissolve in or precipitates out of the solution. Accordingly, in a case where the seed film 5 is made of Cu, and the protection film 6 is made of Co, such a potential as to form a region that is within the region X and does not cause Cu to dissolve at the time of immersion in the plating solution is applied to the seed film 5. With this potential being applied, the seed film 5 is not dissolved while the protection film 6 is dissolved. In a case where the protection film 6 is made of a material other than Co, the same potential relationship as above should be maintained between the material forming the protection film 6 and Cu. Depending on the concentration of the solution, the potential to maintain the balance between precipitation and dissolution of Cu ranges from approximately 0.1 V to 0.34 V, which is the standard electrode potential of Cu. The standard electrode potential is the electrode potential observed in a case where the molar concentration of all the reactants and products in a standard state, or the activity to be more exact, is 1. The standard electrode potential is a value unique to electrodes. Likewise, the potential to maintain the balance between precipitation and dissolution of Co ranges from −0.47 V to −0.277 V, which is the standard electrode potential of Co.

In the above description, dissolution of the seed film 5 is suppressed by adjusting the potential conditions and the likes, but it is also possible to suppress dissolution of the seed film 5 by changing the plating solution. For example, in a case where the protection film 6 is made of W, an oxide or hydroxide might be formed in the surface of the protection film 6 with a plating solution having a pH of 1 to 2. With a copper-pyrophosphate-based plating solution with a pH of 8.5 to 9.0 being used as the plating solution, Cu precipitates out of the solution, and only W and W oxides are dissolved in some region. Accordingly, only the protection film 6 can be dissolved, while the seed film 5 is not dissolved. In this case, W can be used as the material forming the protection film 6. W forms a eutectic structure with Cu but does not form a compound. Having a high melting point, W does not easily have a diffusive reaction. Accordingly, the influence on the later interconnect formation procedure and the likes can be minimized, and W is a desirable material for gettering. Also, Co and the likes are of course effective materials for gettering.

The protection film 6 may be completely removed as shown in FIG. 2C, but may remain as a discontinuous film as long as at least part of the seed film 5 is exposed. In a case where the protection film 6 is completely removed, an increase in interconnect resistance can be restrained. Since Co and the likes accelerate a reaction in Cu plating, any of those materials can accelerate the plating in a case where part of the protection film 6 made of Co is left. Further, as Co or the like diffuses into the interconnects, the reliability of the interconnects can be increased.

Figure 3A:
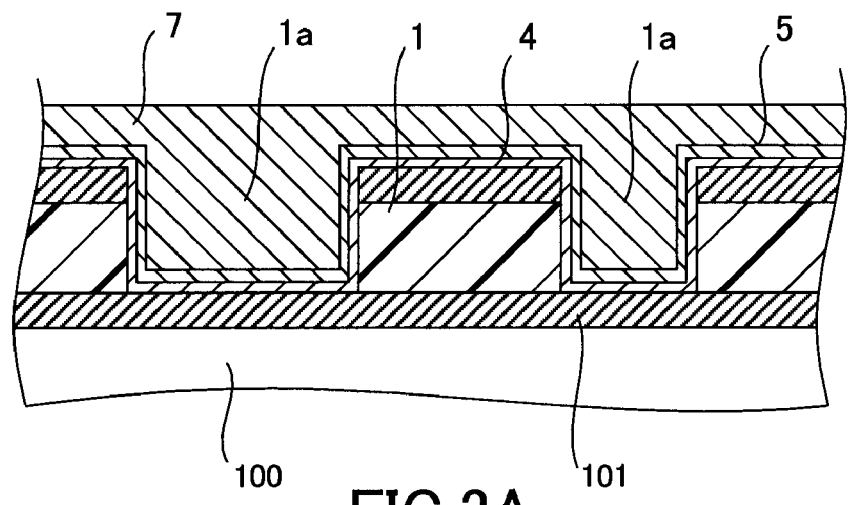
FIGS. 3A through 3C are schematic views illustrating procedures for manufacturing the semiconductor device according to the first embodiment.

With at least part of the seed film 5 being exposed, the current is supplied to the seed film 5 in the plating solution, to form a plating film 7 on the seed film 5 by electrolytic plating, as shown in FIG. 3A (step 8). The plating film 7 is formed to fill the entire recessed portions 1a. The material forming the plating film 7 is Cu, for example.

The potential structure used for plating in the procedures between the removal of the protection film 6 and the growth of the plating film 7 is now described in greater detail. In the following description, the seed film 5 is made of Cu, the protection film 6 is made of Co, and the plating film 7 made of Cu is grown.

As described above, in a Cu plating solution with a pH of 1 to 2, a potential is applied to the substrate, so as to form a potential region where the protection film 6 is dissolved in the plating solution while Cu is not dissolved. With such a potential being applied, the protection film 6 is dissolved in the initial stage, and part of Cu of the seed film 5 is gradually exposed through the substrate surface.

At this point, Cu precipitation starts to form the plating film 7 on the Cu-exposing surface. By applying a potential equal to or little lower than the standard electrode potential of Cu to the substrate in the initial stage, dissolution of Co of the protection film 6 is accelerated in an earlier stage. Therefore, Cu is hardly grown or is grown very slowly. At this point, Cu does not precipitate on the Co surface.

After the protection film 6 is sufficiently removed, plating can be grown by applying such a potential as to allow sufficient plating growth, namely a potential of −0.6 V to −0.2 V to the substrate, for example. Even if the substrate potential enters the re-precipitation potential region of Co, re-precipitation of Co into the Cu film as the plating film 7 does not need to be considered, since the amount of Co is very small, compared with the total amount of the plating solution. In a case where Co is introduced into the plating film 7, a potential is not applied to the substrate, namely is put into an electroless state when a predetermined amount of Co is dissolved. In this manner, displacement plating is caused with part of Cu, so that Cu plating is formed while Co partially remains. A potential is then again applied to the substrate, so that Cu plating is caused on the entire wafer surface.

Figure 3B:
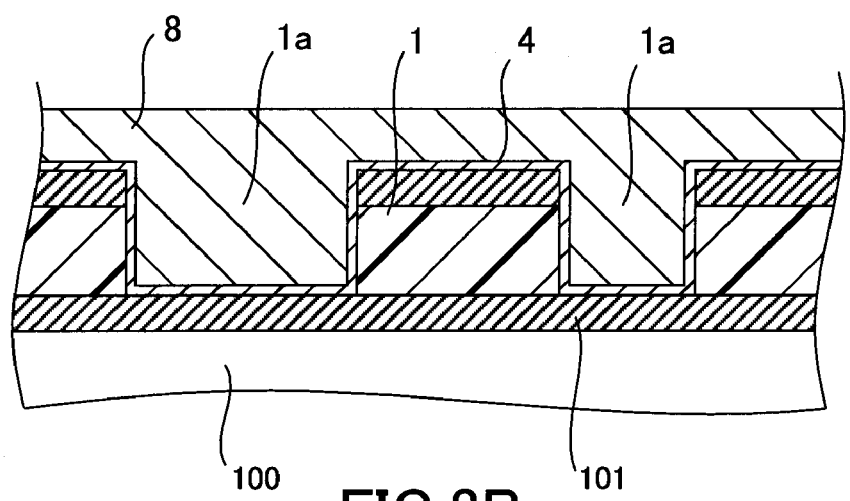

After the plating film 7 is formed in the above described manner, the plating film 7 and others are heat-treated to prevent variations in film quality of the plating film 7 due to changes with time, such as self-aging, so that the crystals of the seed film 5 and the plating film 7 are grown as shown in FIG. 3B (step 9). The seed film 5 and the plating film 7, which have the crystals grown, then turn into an integral film 8 (hereinafter referred to as the interconnect film 8).

Figure 3C:
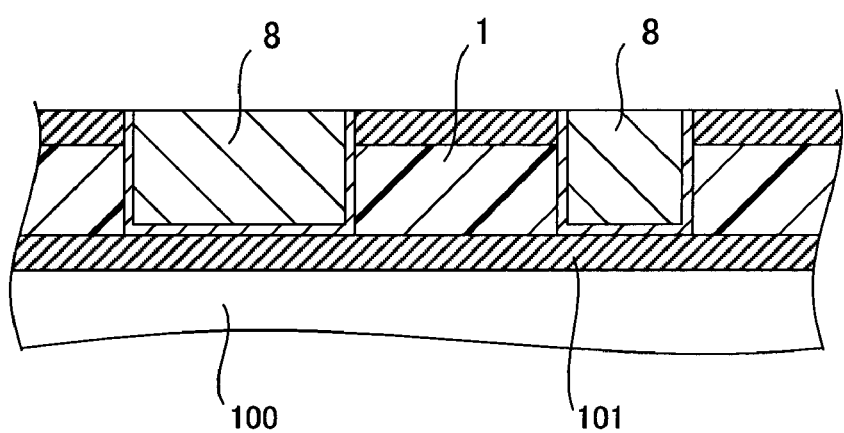

After the interconnect film 8 is formed, polishing is performed by chemical mechanical polishing (CMP) or the like so as to leave the portions of the barrier metal film 4 and the interconnect film 8 inside the recessed portions 1a, to remove the unnecessary portions of the barrier metal film 4 and the interconnect film 8 on the interlayer insulating film 1 (step 10). More specifically, with the substrate 100 being in contact with a polishing pad (not shown), the substrate 100 and the polishing pad are rotated, and a slurry (not shown) is supplied onto the substrate 100, thereby polishing the interconnect film 8 and the likes. Instead of CMP, some other technique may be used to perform the polishing. For example, electrolytic polishing may be performed. In this manner, the portions of the interconnect film 8 and the likes existing outside the recessed portions 1a are removed, so that the interconnect film 8 and the likes remain only in the recessed portions 1a, to form first layer interconnects, as shown in FIG. 3C.

Figure 4A:
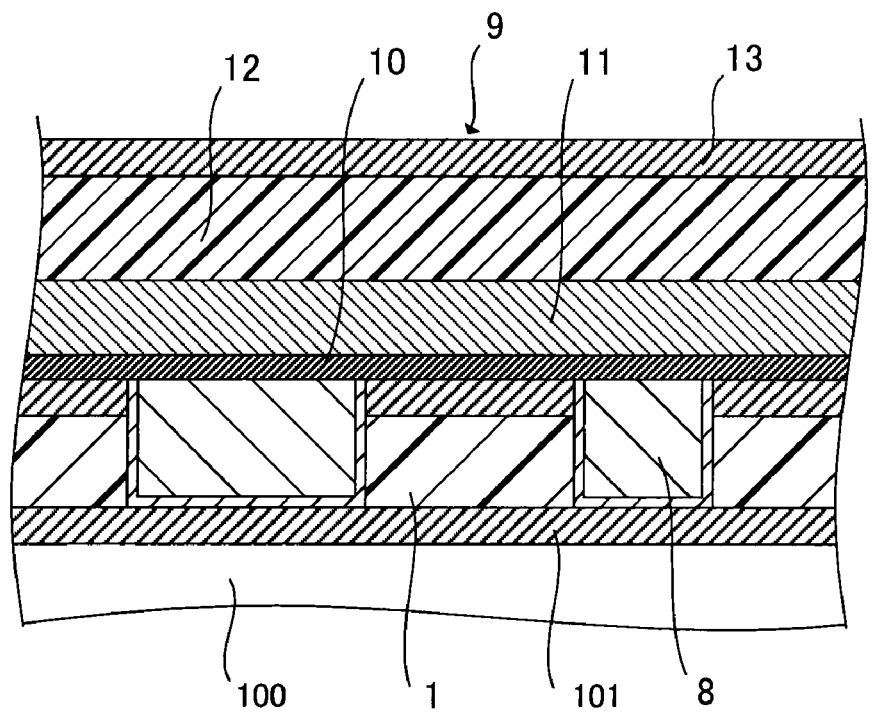
FIGS. 4A and 4B are schematic views illustrating procedures for manufacturing the semiconductor device according to the first embodiment.

As shown in FIG. 4A, an interlayer insulating film 9 is then formed on the interlayer insulating film 1 by the same technique as the technique used to form the interlayer insulating film 1 (step 11). The materials that can form the interlayer insulating film 9 may be the same as the materials that can form the interlayer insulating film 1. In this embodiment, the interlayer insulating film 9 is a stack structure formed with a SiCN film 10 functioning as a RIE stopper film and a suppression film for suppressing diffusion of the interconnect film 8, a SiOC film 11, a polyaryleneether film (PAE film) 12, and a $SiO_2$ film 13 functioning as a protection film in CMP.

Figure 4B:
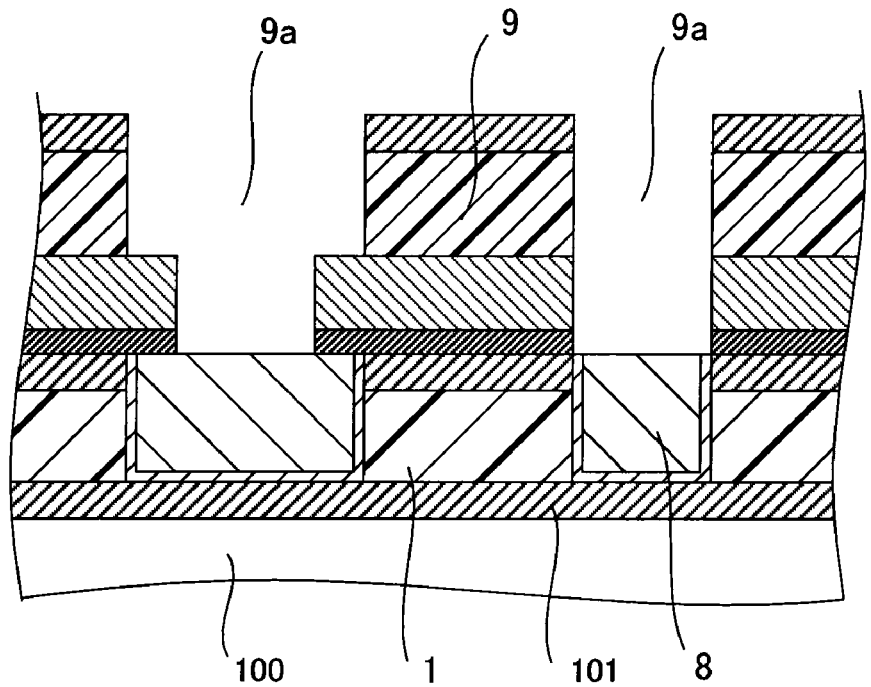

After the interlayer insulating film 9 is formed, recessed portions 9a are formed in the interlayer insulating film 9 by the same technique as the technique used to form the recessed portions 1a, as shown in FIG. 4B (step 12). In this embodiment, the recessed portions 9a function as interconnect grooves and via holes.

Figure 5A:
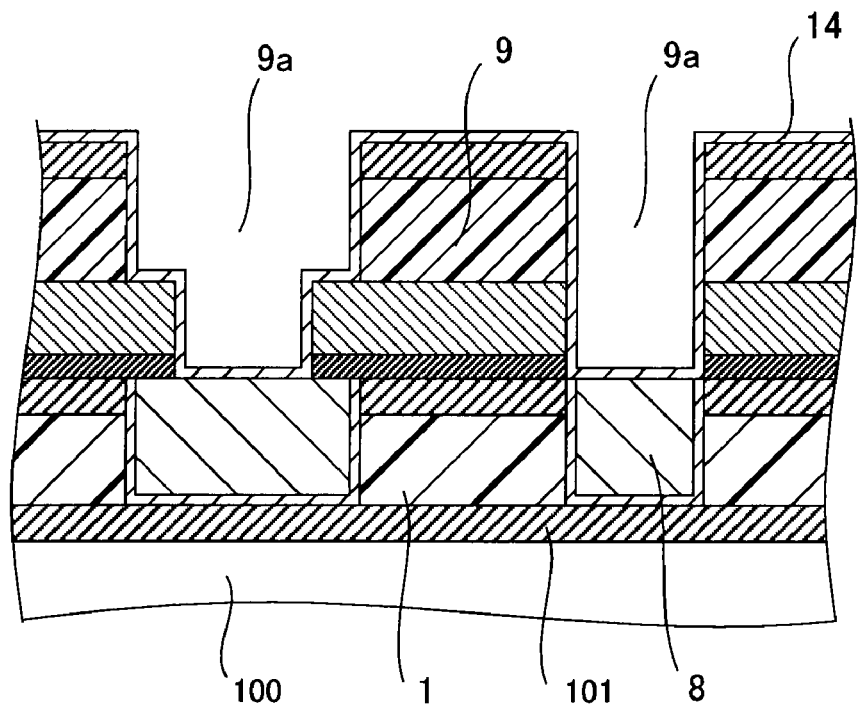
FIGS. 5A and 5B are schematic views illustrating procedures for manufacturing the semiconductor device according to the first embodiment.

After the recessed portions 9a are formed in the interlayer insulating film 9, a barrier metal film 14 is formed on the interlayer insulating film 9 by the same technique as the technique used to form the barrier metal film 4, as shown in FIG. 5A (step 13). The material forming the barrier metal film 14 may be the same as the material forming the barrier metal film 4.

Figure 5B:
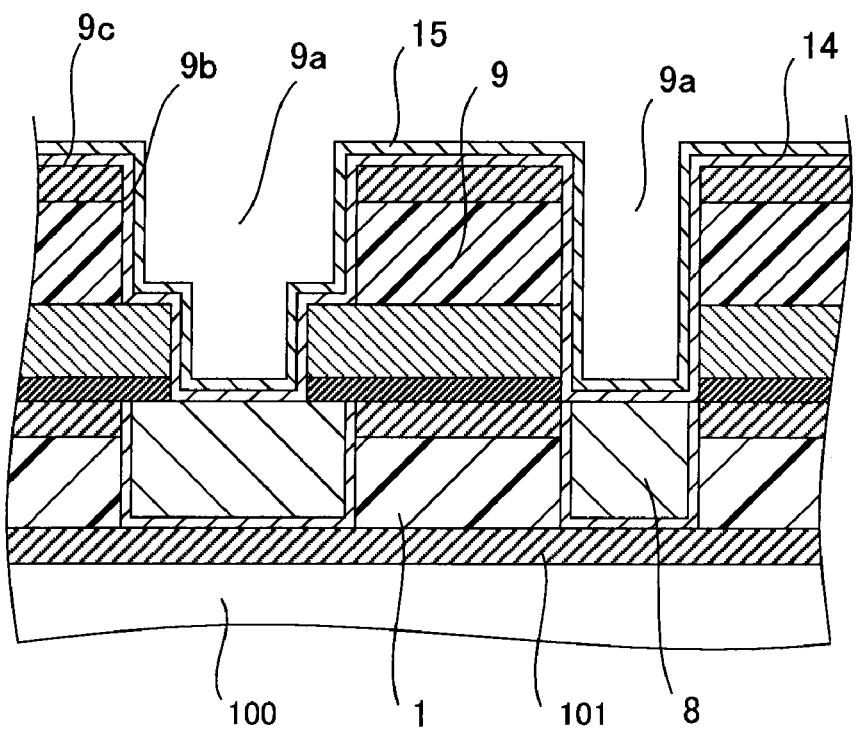

After the barrier metal film 14 is formed on the interlayer insulating film 9, a seed film 15 is formed on the barrier metal film 14 by the same technique as the technique used to form the seed film 5, as shown in FIG. 5B (step 14). The seed film 15 is formed not only on the inner faces 9b of the recessed portions 9a but also on the field portion 9c, which is the surface portion of the interlayer insulating film 9 outside the recessed portions 9a. The material forming the seed film 15 may be Cu, for example.

Figure 6A:
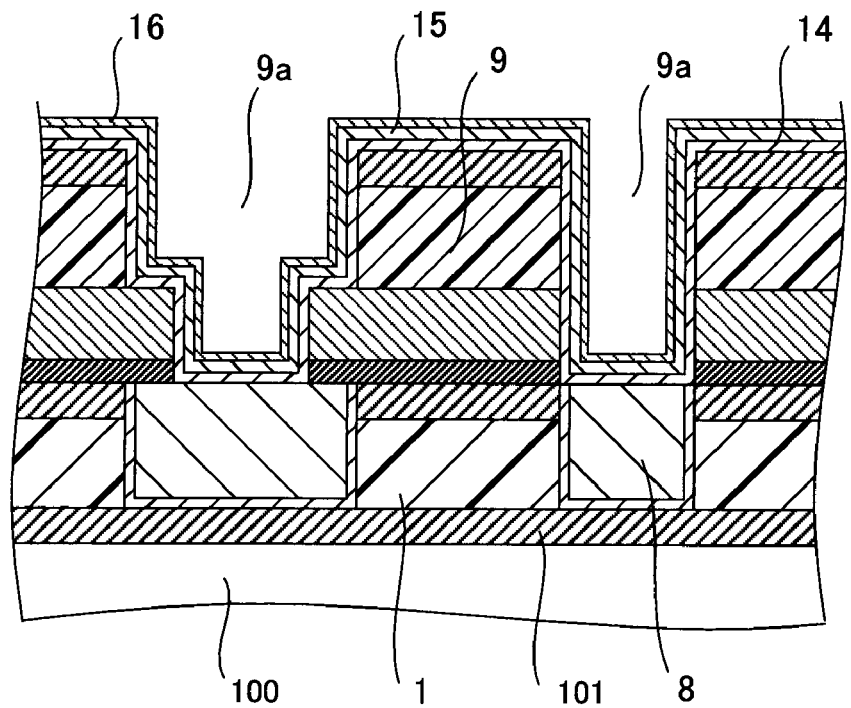
FIGS. 6A and 6B are schematic views illustrating procedures for manufacturing the semiconductor device according to the first embodiment.

After the seed film 15 is formed on the barrier metal film 14, a protection film 16 is formed on the seed film 15 by the same technique as the technique used to form the protection film 6, as shown in FIG. 6A (step 15). The protection film 16 is made of the same material as the material forming the protection film 6, and has the same function as the function of the protection film 6.

After the protection film 16 is formed on the seed film 15, the protection film 16 is heat-treated, like the protection film 6 (step 16).

Figure 6B:
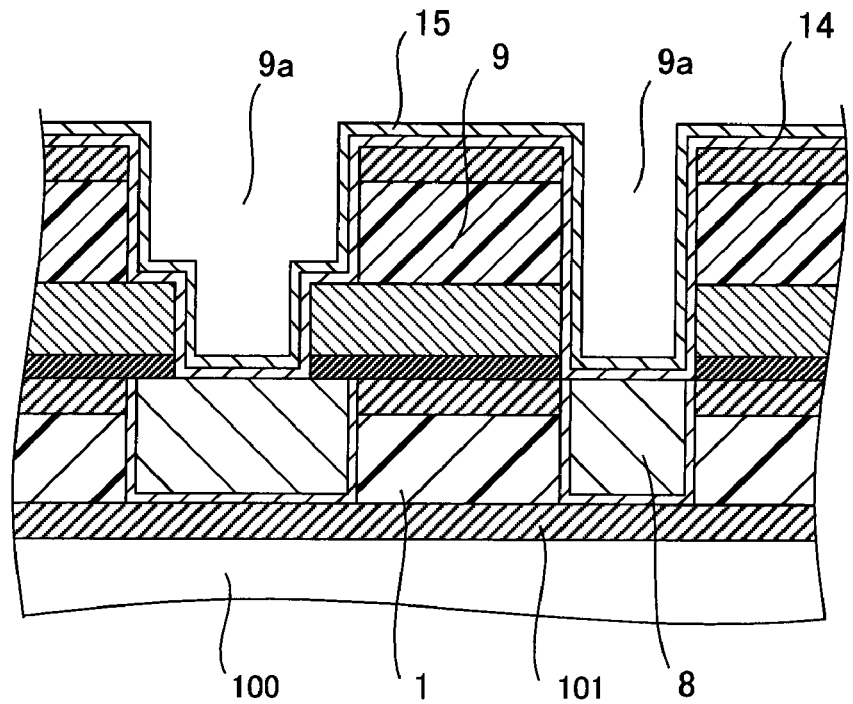

After the protection film 16 is heat-treated, at least part of the protection film 16 is removed, like part of the protection film 6, so that at least part of the seed film 15 is exposed, as shown in FIG. 6B (step 17).

Figure 7A:
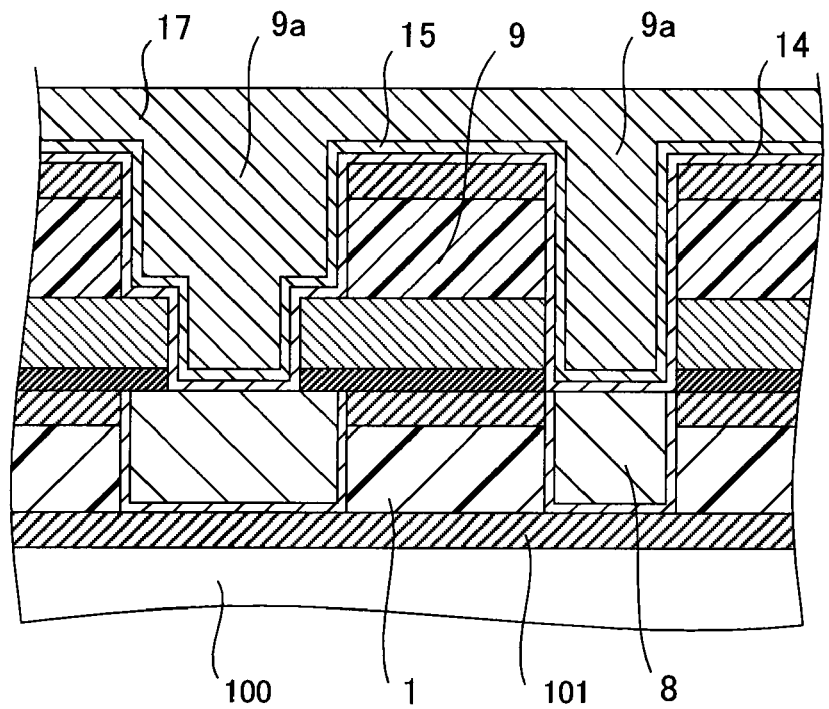
FIGS. 7A and 7B are schematic views illustrating procedures for manufacturing the semiconductor device according to the first embodiment.
Figure 7B:
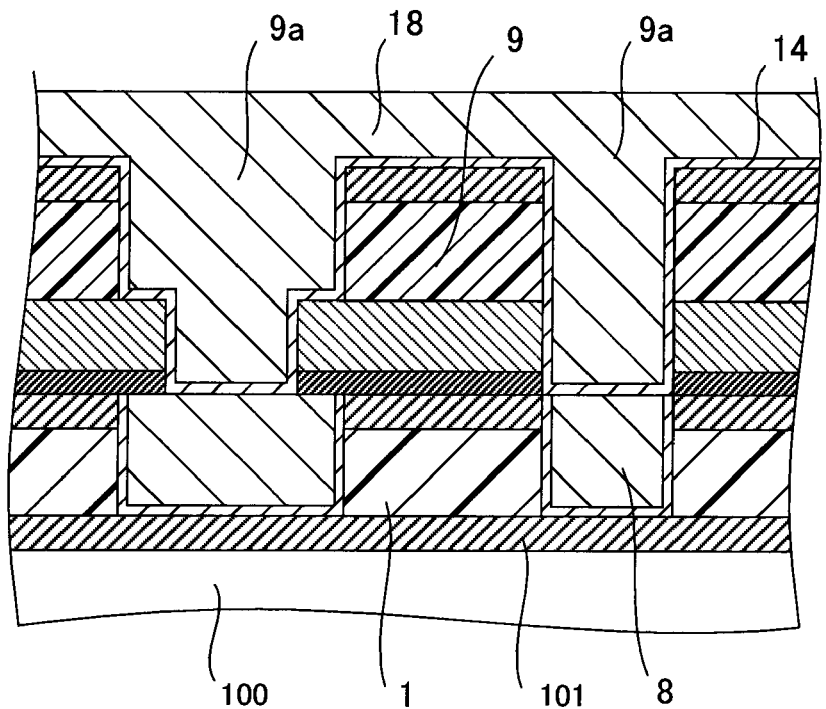

With at least part of the seed film 15 being exposed, the current is supplied to the seed film 15, so that a plating film 17 is formed on the seed film 15 by electrolytic plating, as shown in FIG. 7A (step 18). The plating film 17 is formed to fill the entire recessed portions 9a. The material forming the plating film 17 is a metal such as Cu.

After the plating film 17 is formed, the plating film 17 is heat-treated, like the plating film 7, so that crystals of the seed film 15 and the plating film 17 are grown as shown in FIG. 17B (step 19). The seed film 15 and the plating film 17, which have the crystals grown, then turn into an integral film 18 (hereinafter referred to as the interconnect film 18).

Figure 8:
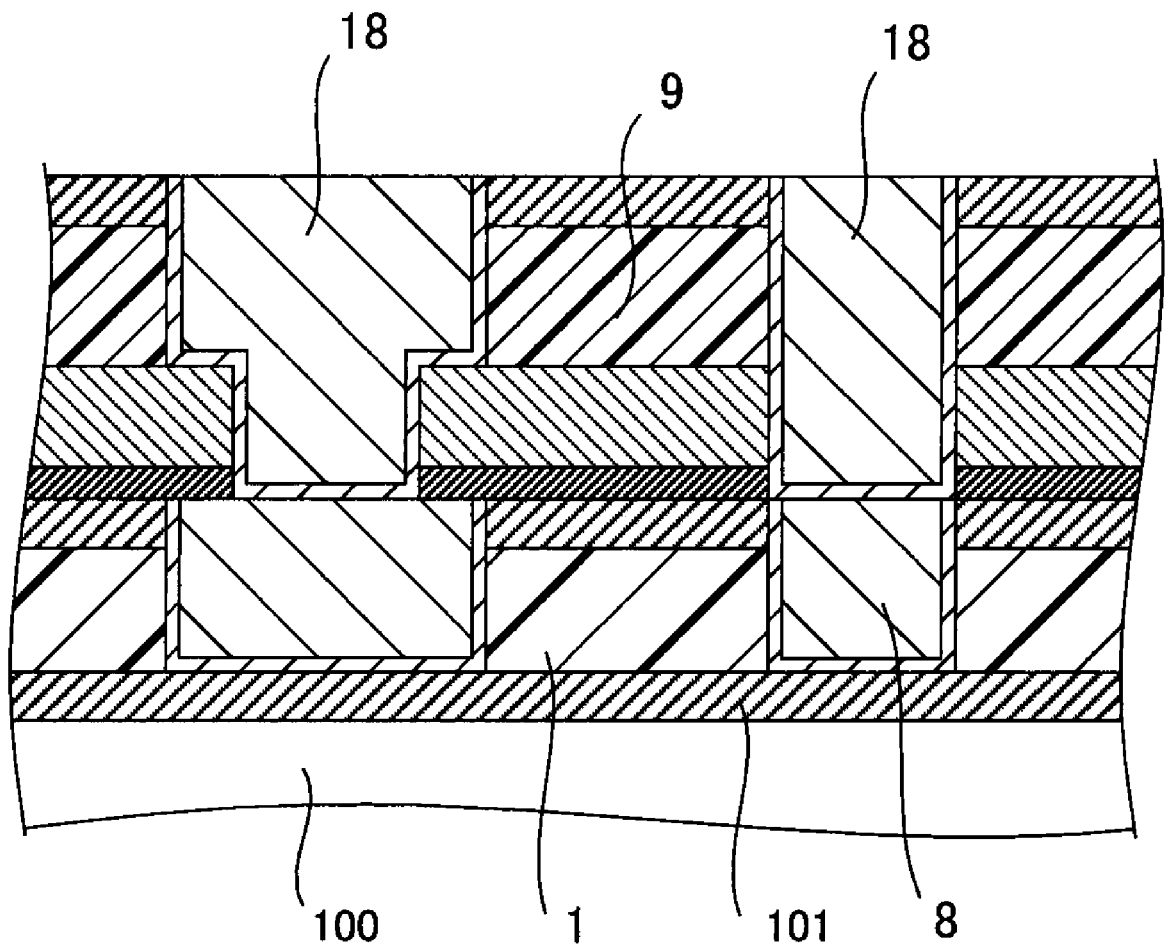
FIG. 8 is a schematic view illustrating a procedure for manufacturing the semiconductor device according to the first embodiment.

After the plating film 17 and others are heat-treated, the unnecessary portions of the barrier metal film 14 and the interconnect film 18 on the interlayer insulating film 9 are removed, like the unnecessary portions of the interconnect film 8 and others (step 20). By doing so, the portions of the interconnect film 18 and others located outside the recessed portions 9a are removed, so that the interconnect film 18 and others remain only inside the recessed portions 9a, to form second layer interconnects, as shown in FIG. 8. After that, steps 11 through 20 may be repeated to form third layer interconnects and the likes as needed.

In accordance with this embodiment, the protection films 6 and 16 are formed on the seed films 5 and 15, and the protection films 6 and 16 are heat-treated. By doing so, oxidation of the seed films 5 and 15 can be suppressed. Since the protection films 6 and 16 are made of a material that is more easily oxidized than the material forming the seed films 5 and 15, the protection films 6 and 16 are oxidized preferentially over the seed films 5 and 15, when being exposed to the atmosphere prior to electrolytic plating. Even in a case where the protection films 6 and 16 are not formed in vacuum immediately after the formation of the seed films 5 and 15, and the protection films 6 and 16 are formed after being exposed to the atmosphere, the protection films 6 and 16 are heat-treated, so as to getter the oxygen existing in the seed films 5 and 15 and the surfaces thereof. By doing so, oxidation of the seed films 5 and 15 can be suppressed.

In accordance with this embodiment, at least part of the protection films 6 and 16 is dissolved in a plating solution, to expose at least part of the seed films 5 and 15. Accordingly, plating can be performed, without the seed films 5 and 15 being exposed to the atmosphere.

In a case where a seed film is a thin film, the seed film easily aggregates during a heat treatment. In this embodiment, on the other hand, the protection films 6 and 16 are formed on the seed films 5 and 15, so that the material forming the protection films 6 and 16 diffuses into the seed films 5 and 15. Accordingly, even if the seed films 5 and 15 are thin films, aggregation of the seed films 5 and 15 can be suppressed.

Although the protection film 6 is heat-treated in this embodiment, the protection film 6 may not be heat-treated. In such a case, the protection film 6 is stacked on the seed film 5 after the procedure for forming the seed film 5, while the protection film 6 and the seed film 5 are not exposed to the atmosphere. The procedures to be carried out thereafter are the same as those of the above described embodiment, except that the protection film 6 is not heat-treated. In this manner, oxidation of the seed film 5 can also be suppressed, since the protection film 6 made of Co or the like is formed on the seed film 5 made of Cu. As described above, Co or the like is more easily oxidized than Cu, and accordingly, the protection film 6 made of Co or the like is oxidized preferentially over the seed film 5 made of Cu. Once Co or the like is oxidized, it has passivity or properties similar to passivity. Accordingly, oxygen does not easily permeate into the protection film 6 formed with Co oxide. Thus, oxidation of the seed film 5 can be suppressed.

Second Embodiment

Figure 10A:
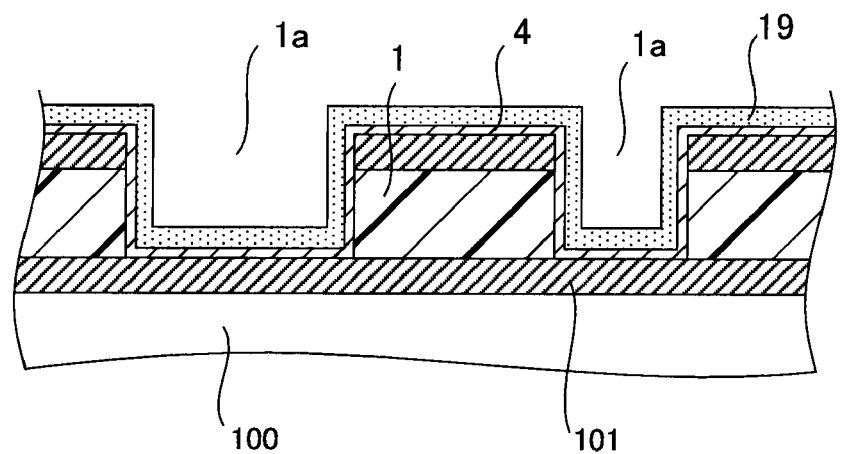
FIGS. 10A through 10C are schematic views illustrating procedures for manufacturing a semiconductor device according to a second embodiment.
Figure 10B:
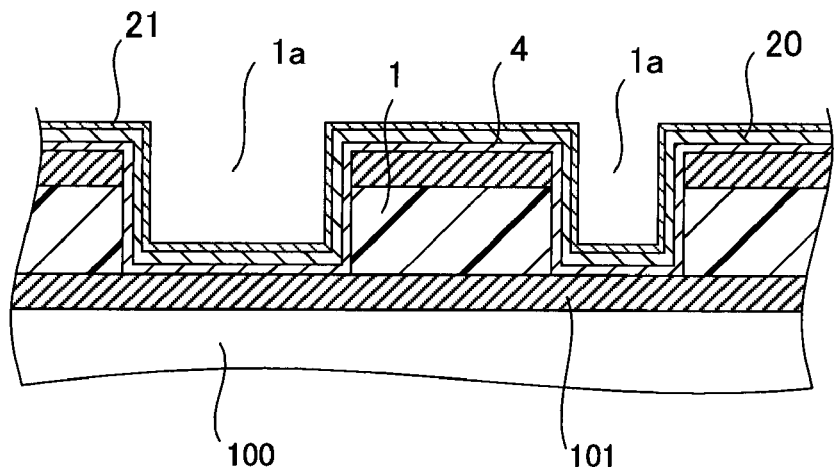
Figure 10C:
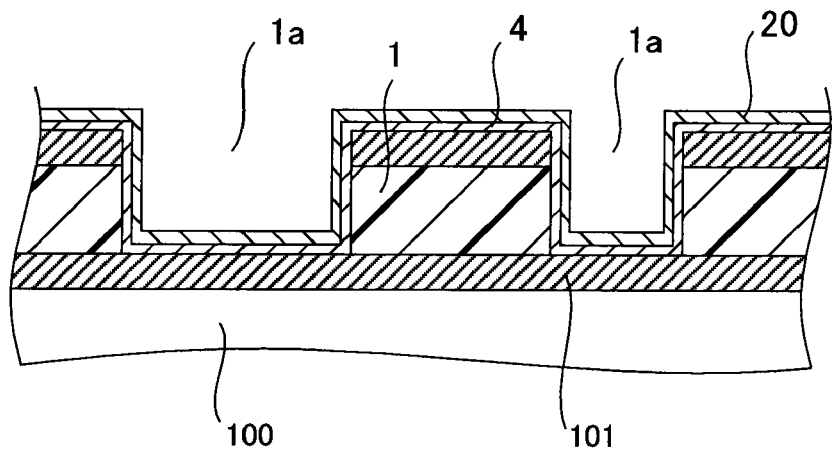

The following is a description of a second embodiment of the present invention, with reference to the accompanying drawings. In this embodiment and the embodiments described later, description of the same aspects as those of the first embodiment is not repeated. In this embodiment, an alloy film formed with a first metal and a second metal that is easily oxidized than the first metal is formed on a barrier metal film. FIGS. 10A through 10C are schematic views illustrating procedures for manufacturing a semiconductor device according to this embodiment.

As in the first embodiment, the interlayer insulating film 1, the recessed portions 1a, and the barrier metal film 4 are formed. In this embodiment, an alloy film 19 is then formed on the barrier metal film 4 by PVD, CVD, or ALD, as shown in FIG. 10A. The alloy film 19 is formed with a first metal and at least one second metal that is added to the first metal and is more easily oxidized than the first metal. Whether the second metal is more easily oxidized than the first metal can be determined by the same method as the method described in the first embodiment. More specifically, where the first metal is Cu, examples of seconds metals that are more easily oxidized than the first metal include Co, Ni, Zn, V, Cr, W, Mn, Al, Nb, and Ti, with Mn being particularly preferred.

After the alloy film 19 is formed on the barrier metal film 4, the alloy film 19 is heat-treated. The added metal tends to diffuse and precipitate on an interface between different materials, that is, on the surface of the alloy film 19 and the boundary face with the barrier metal film 4, during a heat treatment in vacuum or in an inert gas atmosphere. More preferably, where a small amount of oxidation atmosphere or added metal forms a nitride, a heat treatment is performed in a nitridation atmosphere to facilitate precipitation on the surface side of the added metal. By doing so, an oxidation or nitridation reaction of the added metal on the surface side is facilitated, to cause a concentration gradient in the film. Thus, diffusion and precipitation of the added metal into the film surface are facilitated.

The temperature in the heat treatment may be 450° C. or lower, which is an allowed temperature in a Cu interconnect formation process. To suppress aggregation, however, the temperature is more preferably 250° C. or lower. As described above, where a reaction is facilitated on the surface side of the alloy film, it is preferable to heat-treated under reduced pressure, so as to suppress excess oxidation. Through this heat treatment, the second metal migrates to the surface of the alloy film 19, and the second metal is oxidized or nitrided. When being exposed to the atmosphere prior to electrolytic plating, the reaction layer on the surface side is oxidized. By doing so, the alloy film 19 is turned into a seed film 20 made of the first metal and a protection film 21 made of an oxide of the second metal on the seed film 20, as shown in FIG. 10B.

After the seed film 20 and the protection film 21 are formed, the conditions are controlled in the same manner as in the first embodiment, and at least part of the protection film 21 is removed to expose at least part of the seed film 20, as shown in FIG. 10C. The procedures to be carried out thereafter are the same as those of the first embodiment. As in the first embodiment, the plating film 7 may be formed where the protection film 20 is completely removed or is partially left.

In accordance with this embodiment, the alloy film 19 formed with the first metal and the second metal is formed, and is heat-treated, to form the seed film 20 and the protection film 21 made of an oxide of the second metal on the seed film 20. Since the second metal is more easily oxidized than the first metal, the second metal is oxidized preferentially over the first metal. Once the second metal is oxidized, it has passivity or properties similar to passivity. Accordingly, oxygen does not easily permeate into the protection film 21 formed with an oxide of the second metal. Among the above described metals, the metals that have passive properties as oxides are Co, Ni, Cr, Al, Ti, and an alloy containing at least one of those materials. Other than that, any metal that is easily oxidized by Cu generally has the same properties as above. Thus, oxidation of the seed film 20 can be suppressed.

In accordance with this embodiment, the seed film 20 and the protection film 21 are formed from the alloy film 19. Accordingly, the number of chambers required for film formation can be made smaller by one, compared with the number of chambers required in a case where the seed film 20 and the protection film 21 are formed separately from each other. Thus, the seed film 20 and the protection film 21 can be efficiently formed.

Further, as described in the first embodiment, in a case where a seed film is a thin film, the seed film easily aggregates during a heat treatment. In this embodiment, on the other hand, the alloy film 19 having the second metal added to the first metal is formed, and accordingly, aggregation of the first metal can be suppressed by the second metal. Since the second metal diffuses into the first metal, aggregation of the seed film can be suppressed with higher precision by the formation of the alloy film 19 in this embodiment than the formation of the protection films 6 and 16 on the seed films 5 and 15 as in the first embodiment. In this manner, the heat treatment can be more effectively performed at the time of the formation of the protection film 21 and oxygen gettering.

Third Embodiment

Figure 11:
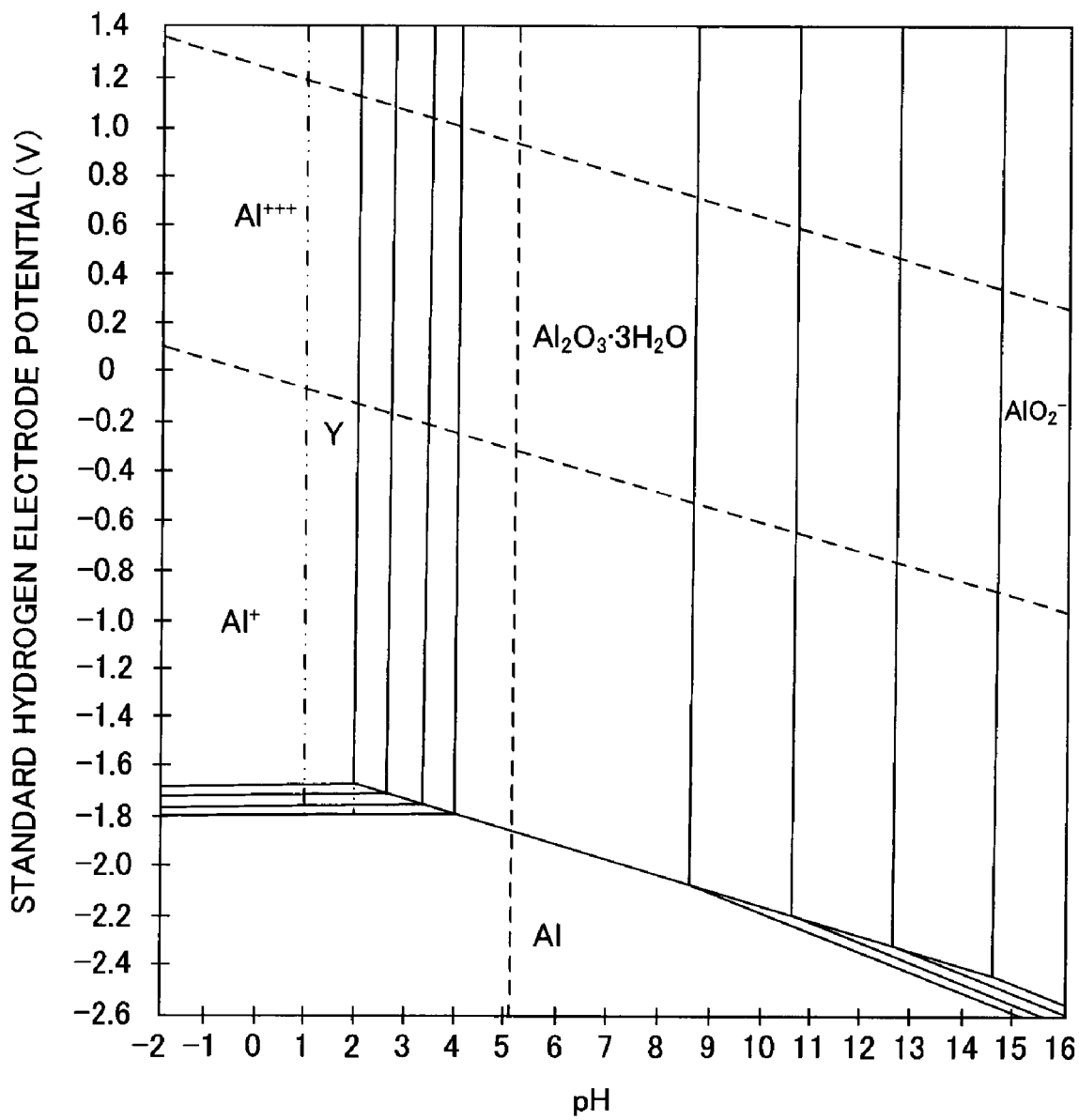
FIG. 11 is a potential-pH diagram in the case of Al.

Next, a third embodiment of the present invention is described. In the second embodiment, the second metal may be Co, Ni, Zn, V, Cr, W, Mn, Al, Nb, Ti, or the like, where Cu is used as the first metal. In this embodiment, on the other hand, Cu is used as the first metal, and Al is used as the second metal. FIG. 11 is a potential-pH diagram in the case of Al.

As in the second embodiment, the interlayer insulating film 1, the recessed portions 1a, the barrier metal film 4, and the alloy film 19 are formed. In this embodiment, Cu is used as the first metal of the alloy film 19, and Al is used as the second metal of the alloy film 19. The alloy 19 can be formed by PVD, CVD, or ALD, as in the second embodiment.

After the alloy film 19 is formed on the barrier metal film 4, the alloy film 19 is heat-treated. Through this heat treatment, Al migrates to the surface of the alloy film 19, and is also oxidized. This is because an added metal tends to diffuse into the interface between different materials, and precipitate on the interface, as mentioned in the second embodiment. An oxidation atmosphere is used as a heat treatment condition, so that surface precipitation of Al and formation of $AlO_x$ are caused, to facilitate precipitation of Al on the surface further. As the $AlO_x$ is formed as a film on the entire surface of the alloy film 19, the $AlO_x$ film functions as an oxidation suppression film, so that the oxidation does not proceed further. In this manner, the seed film 20 made mainly of Cu and the protection film 21 made of $AlO_x$ on the seed film 20 are formed from the alloy film 19.

After the seed film 20 and the protection film 21 are formed, the protection film 21 is dissolved in a plating solution, so that at least part of the protection film 21 is removed to expose at least part of the seed film 20. Here, such a potential is applied to the seed film 20 and the protection film 21 that the Cu as the main component of the seed film 20 is not dissolved in the plating solution with a pH of 1 to 2, but $AlO_x$ is dissolved in the plating solution. More specifically, in a case where a copper-sulfate-based solution is used as the plating solution, for example, Al is ionized (dissolved) within a potential region Y of approximately −1.8 V or higher with respect to a pH of 1 to 2, which is the pH of the plating solution. This region Y represents the region where Al and $AlO_x$ are both dissolved. Meanwhile, in a potential-pH diagram in the case of Cu (not shown), a region where Cu is not dissolved or precipitates exists in a potential range of approximately −1.8 V to 0.1 V within the region Y where Al is dissolved. Accordingly, where the alloy film 19 is formed with Cu and Al, such a potential as to form a region where Cu is not dissolved at the time of immersion in the plating solution within the region Y, namely a potential of −1 V with respect to the standard hydrogen electrode potential, for example, is applied to the seed film 20 and the protection film 21. By applying the potential, the $AlO_x$ of the protection film 21 can be dissolved while the Cu forming the seed film 20 is not dissolved in the plating solution. Depending on the concentration of the solution, the potential to maintain the balance between precipitation and dissolution of Cu ranges from approximately 0.1 V to 0.34 V, which is the standard electrode potential of Cu. Likewise, the potential to maintain the balance between precipitation and dissolution of Al ranges from −1.8 V to −1.67 V, which is the standard electrode potential of Al.

After $AlO_x$ is dissolved, the applied voltage is switched to a voltage suitable for burying, and the plating film 7 is formed. More specifically, precipitation of Cu of the plating film 7 starts on the Cu-exposing surface of the seed film 20, as in the first embodiment. By applying a potential equal to or little lower than the standard electrode potential of Cu to the substrate in the initial stage, dissolution of $AlO_x$ and Al of the protection film 6 is accelerated in an earlier stage, so that Cu is hardly grown or is grown very slowly. At this point, Cu does not precipitate on the Al surface. After the protection film 21 is sufficiently removed, plating can be grown by applying such a potential as to allow sufficient plating growth, namely a potential of −0.6 V to −0.2 V to the substrate, for example. Where the protection film 21 is an $AlO_x$ film, the initial precipitation potential of Al is lower than the plating potential of Cu. Accordingly, a Cu film can be grown at a sufficiently high speed, without re-precipitation of Al being taken into consideration. This is one of the preferred features of this embodiment. The procedures to be carried out after the formation of the plating film 7 are the same as those of the first embodiment.

In accordance with this embodiment, Cu is used as the first metal of the alloy film 19, and Al is used as the second metal of the alloy film 19. Accordingly, not only the same effects as those of the second embodiment can be achieved, but also oxidation of the seed film 20 can be more effectively suppressed, since an oxide of Al (AlO$_x$) is stable and has excellent compatibility with Cu.

Fourth Embodiment

Figure 12:
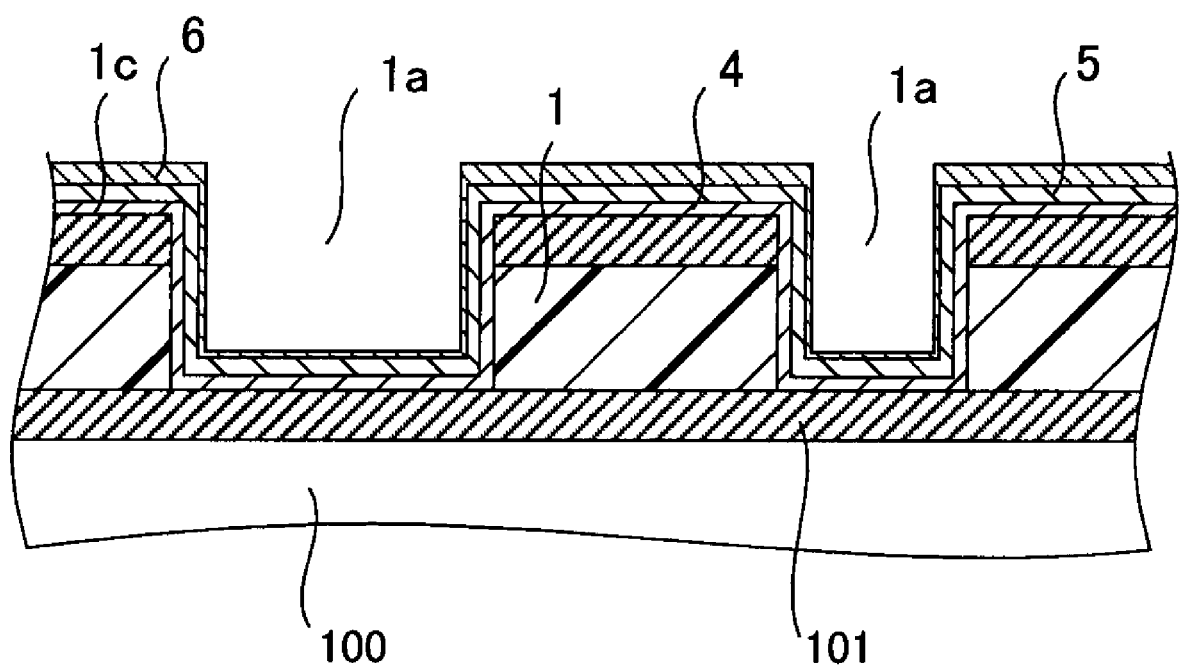
FIG. 12 is a schematic view illustrating a procedure for manufacturing a semiconductor device according to a fourth embodiment.

The following is a description of a fourth embodiment of the present invention, with reference to the accompanying drawings. In this embodiment, a protection film that is thinner in the recessed portions than on the field portion of the interlayer insulating film is formed. FIG. 12 is a schematic view illustrating a procedure for manufacturing a semiconductor device according to this embodiment.

As in the first embodiment, the interlayer insulating film 1, the recessed portions 1a, the barrier metal film 4, the seed film 5, and the protection film 6 are formed. In this embodiment, the protection film 6 is formed to be thinner in the recessed portions 1a than on the surface portion of the substrate outside the recessed portions 1a, that is, on the field portion is of the interlayer insulating film 1, as shown in FIG. 12. More specifically, the protection film 6 may be formed to be thinner inside the recessed portions 1a than on the field portion is in the initial stage, or the protection film 6 may be made thinner inside the recessed portion 1a than on the filed film is by etching to reduce the thickness of the portion of the protection film 6 at the bottom or sidewall of each recessed portion 1a by sputtering or the like after the film formation of the protection film 6.

After the protection film 6 having the above structure is formed, at least part of the protection film 6 is removed to expose at least part of the seed film 5, as in the first embodiment. The procedures to be carried out thereafter are the same as those of the first embodiment.

In accordance with this embodiment, the protection film 6 is formed to be thinner inside the recessed portions 1a than on the field portion 1c of the interlayer insulating film 1. Accordingly, when the protection film 6 is dissolved in a plating solution, the portions of the seed film 5 inside the recessed portions 1a are exposed faster than the portion of the seed film 5 on the field portion 1c. Accordingly, the plating film 7 can be selectively formed inside the recessed portions 1a. Thus, film growth of the plating film 7 on the field portion 1c can be suppressed, and the load in CMP can be reduced.

Fifth Embodiment

The following is a description of a fifth embodiment of the present invention, with reference to the accompanying drawings. In this embodiment, the amount of the Al precipitate on the Cu surface is controlled where Cu is used as the first metal and Al is used as the second metal as in the third embodiment. FIGS. 13A through 14C are schematic views illustrating procedures for manufacturing a semiconductor device according to this embodiment.

As in the third embodiment, the interlayer insulating film 1, the recessed portions 1a, the barrier metal film 4, and the alloy film 19 are formed. In this embodiment, the amount of the Al precipitate on the surface of Cu as the main component element of the seed film 20 is controlled. Where the alloy film 19 is formed with CuAl$_x$, the total amount of Al contained in the alloy film 19 has a correlation with the amount of Al diffusing into and precipitating on the surface side of the alloy film 19. Accordingly, as the amount of Al contained in the alloy film 19 becomes larger, the amount of Al diffusing into and precipitating on the surface side of the alloy film 19 becomes larger.

Figure 13A:
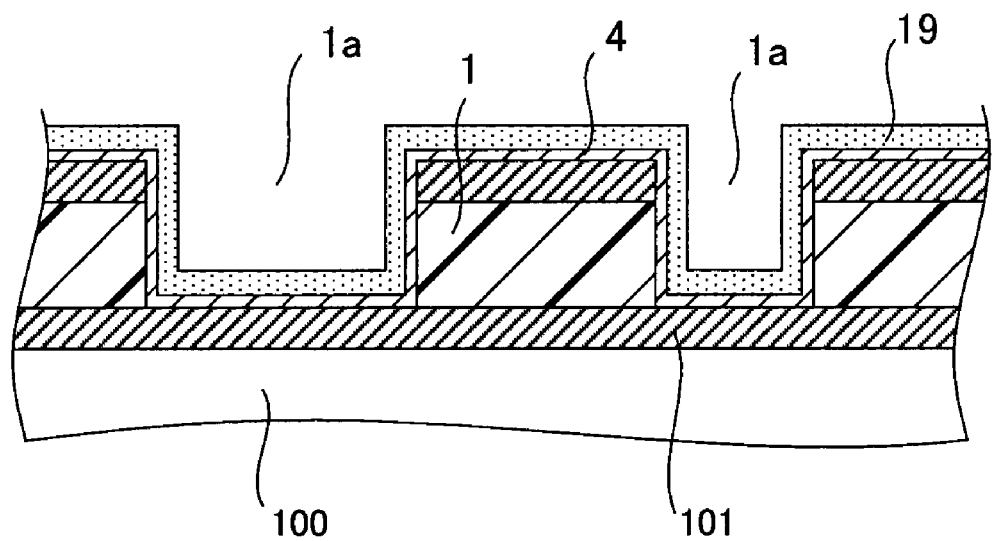
FIGS. 13A and 13B are schematic views illustrating procedures for manufacturing a semiconductor device according to a fifth embodiment.
Figure 13B:
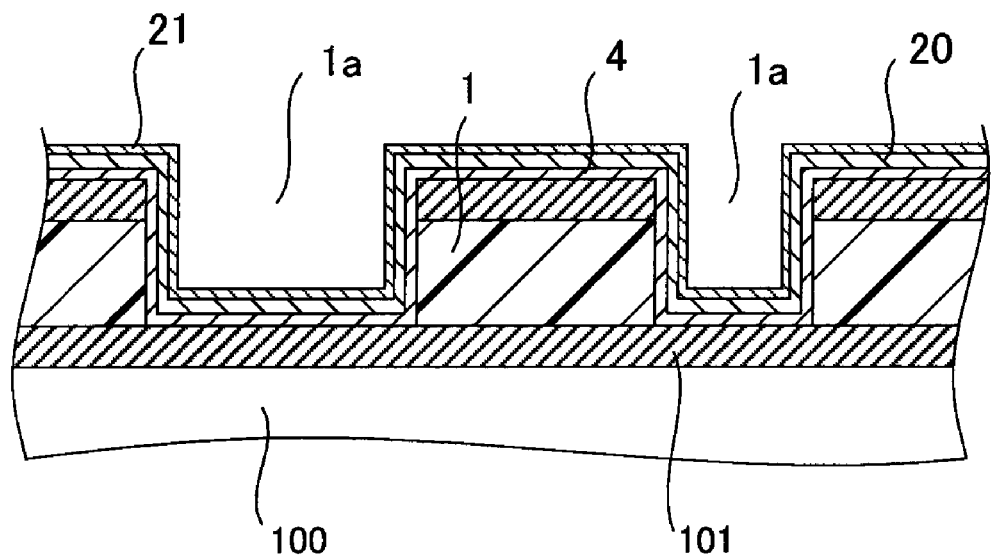

In a case where Al is precipitated uniformly on the Cu surface, for example, the bias or the like to be applied to the substrate at the time of film formation of the alloy film 19 is controlled, to form the alloy film 19 having substantially a uniform film thickness, as shown in FIG. 13A. Since the film thickness of the alloy film 19 is almost uniform in this case, almost a uniform amount of Al precipitates on the surface of Cu as the main component element of the seed film 20, and Al is oxidized, after the alloy film 19 is heat-treated. Accordingly, the protection film 21 having an AlOx film with substantially a uniform thickness is formed, as shown in FIG. 13B.

Figure 14A:
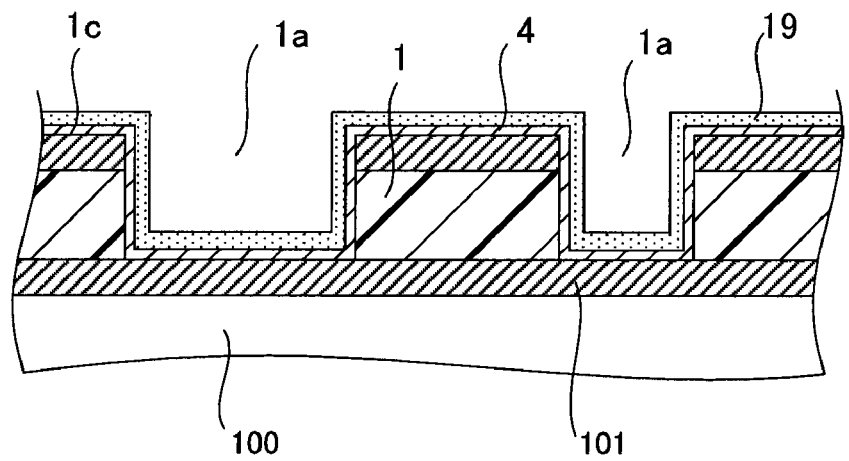
FIGS. 14A through 14C are schematic views illustrating procedures for manufacturing the semiconductor device according to the fifth embodiment.
Figure 14B:
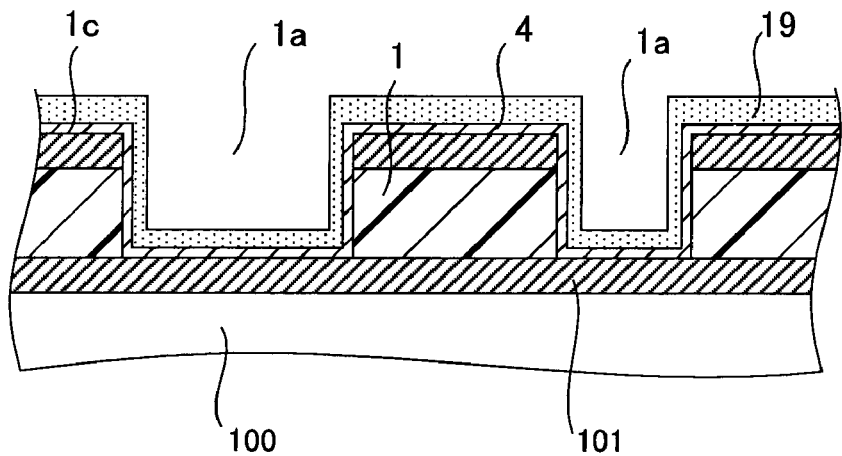
Figure 14C:
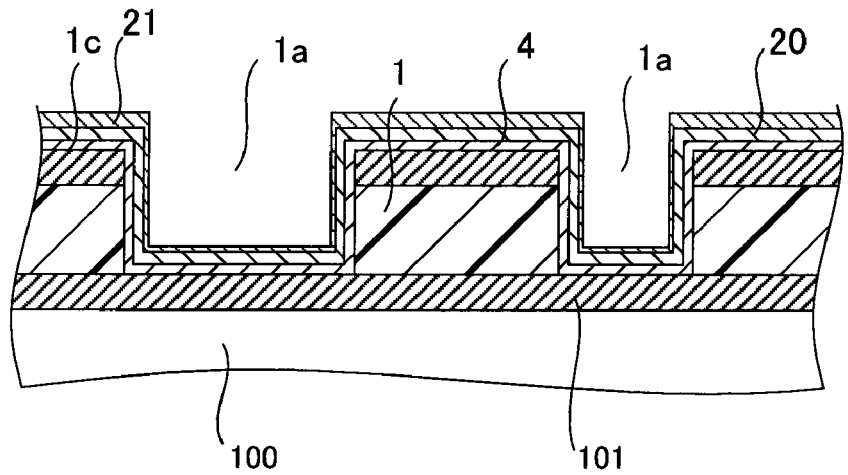

The amount of Al precipitating on the surface of Cu may be varied with locations. For example, the bias to be applied to the substrate at the time of film formation of the alloy film 19 is controlled, so as to form the alloy film 19 having substantially a uniform film thickness on the sidewall portions and bottom portions of the recessed portions 1a, as shown in FIG. 14A. The metal drawing bias is turned off or the like, so as not to cause film formation inside the recessed portions 1a. By doing so, the alloy film 19 is additionally stacked on the surface portion of the substrate outside the recessed portions 1, that is, on the field portion 1c, as shown in FIG. 14B. As a result, the film thickness of the portion of the alloy film 19 on the field portion 1c is increased. Accordingly, the amount of Al contained in the portion of the alloy film 19 on the field portion 1c becomes larger than the amount of Al contained in the portions of the alloy film 19 inside the recessed portions 1a. After the alloy film 19 is heat-treated, a larger amount of Al precipitates on the field portion 1c than inside the recessed portions 1a. In this manner, the portion of the protection film 21 formed with an AlO$_x$ film with a greater film thickness is formed on the field portion 1c, and the portions of the protection film 21 that are AlO$_x$ films with smaller film thicknesses are formed inside the recessed portions 1a.

The protection film 21 is then dissolved in a plating solution, and at least part of the protection film 21 is removed to expose at least part of the seed film 20. Here, such a potential is applied to the seed film 20 and the protection film 21 that the Cu as the main component of the seed film 20 is not dissolved in the plating solution with a pH of 1 to 2, but AlO$_x$ is dissolved in the plating solution. In a case where the protection film 21 with substantially a uniform film thickness is formed, removal of the protection film 21 at the respective locations can be finished almost at the same time. In a case where the portion of the protection film 21 formed on the field portion is has a greater film thickness, and the portions of the protection film 21 formed inside the recessed portions each have a smaller film thickness, the portions of the protection film 21 inside the recessed portions 1a finish dissolving before the portion of the protection film 21 on the field portion 1c does.

After the protection film 21 is removed through dissolution, the applied voltage is switched to a voltage suitable for burying, and the plating film 7 is formed. The procedures to be carried out thereafter are the same as those of the first embodiment.

In accordance with this embodiment, in a case where the protection film 21 having substantially a uniform film thickness is formed by controlling the amount of the precipitate of Al contained in the alloy film 19, the protection film 21 can be uniformly removed at the respective locations. Accordingly, the removal of the protection film 21 can be finished almost at the same time at the respective locations.

In accordance with this embodiment, in a case where the portion of the protection film 21 on the field portion 1c is made thicker, and the portions of the protection film 21 inside the recessed portions 1a are made thinner by controlling the amount of the precipitate of Al contained in the alloy film 19 into the alloy surface, the plating film 7 can be formed, with the protection film 21 remaining on the field portion 1c. In this case, since the plating film 7 is hardly formed on the portion of the protection film 21 remaining on the field portion 1c, the plating film 7 can be formed only in the recessed portions 1a. This arrangement achieves the same effect as the effect of a suppressor for suppressing growth of a plating film on the filed portion is to cause bottom-up growth. Thus, bottom-up growth of the plating film 7 can be realized by this effect.

The present invention is not limited to the specific contents of the above embodiments, and the structures, materials, and layouts of the respective components may be changed without departing from the scope of the present invention. For example, the procedure for forming the first layer interconnects is described in the second through fifth embodiments, but the second layer interconnects may be formed through the same procedure as that.

What is claimed is:

1. A method for manufacturing a semiconductor device, comprising:
    forming a seed film at least on an inner face of a recessed portion of a substrate;
    forming a protection film on the seed film, the protection film being made of a material that is more easily oxidized than a material forming the seed film;
    heat-treating the protection film;
    exposing at least part of the seed film by removing at least part of the heat-treated protection film;
    forming a plating film on the seed film through electrolytic plating to be buried in the recessed portion, by supplying current to the seed film that is at least partially exposed; and
    removing the plating film except for a portion buried in the recessed portion.

2. The method according to claim 1, wherein
    the material forming the seed film is Cu, and
    a material forming the protection film is at least one metal selected from the group consisting of Co, Ni, Zn, V, Cr, W, Mn, Al, Nb, and Ti.

3. The method according to claim 1, wherein the at least part of the protection film is removed by dissolving the protection film in a plating solution.

4. The method according to claim 3, wherein the plating solution contains copper sulfate.

5. The method according to claim 3, wherein the protection film is dissolved, while a potential is applied to the seed film so as not to dissolve the material forming the seed film in the plating solution, but as to dissolve a material forming the protection film in the plating solution.

6. The method according to claim 1, wherein the plating film is formed, with the protection film being completely removed.

7. The method according to claim 1, wherein the plating film is formed, with part of the protection film being left.

8. The method according to claim 1, wherein the protection film is formed, with a film thickness of the protection film being smaller inside the recessed portion than on a surface portion of the substrate outside the recessed portion.

9. The method according to claim 1, wherein oxygen in the seed film is gettered by the protection film in the heat-treating the protection film.

10. The method according to claim 1, wherein the heat-treating the protection film is performed in a vacuum or in an atmosphere where an insert gas or a reduction gas exists.

11. A method for manufacturing a semiconductor device, comprising:
    forming an alloy film at least on an inner face of a recessed portion of a substrate, the alloy film being formed with a first metal and at least one second metal that is more easily oxidized than the first metal;
    forming a seed film comprising the first metal and a protection film comprising an oxide of the second metal on the seed film, by heat-treating the alloy film;
    exposing at least part of the seed film by removing at least part of the protection film;
    forming a plating film on the seed film through electrolytic plating to be buried in the recessed portion, by supplying current to the seed film that is at least partially exposed; and
    removing a portion of the plating film except for a portion buried in the recessed portion.

12. The method according to claim 11, wherein
    the first metal is Cu, and
    the second metal is at least one metal selected from the group consisting of Co, Ni, Zn, V, Cr, W, Mn, Al, Nb, and Ti.

13. The method according to claim 12, wherein the second metal is Al.

14. The method according to claim 11, wherein the at least part of the protection film is removed by dissolving the protection film in a plating solution.

15. The method according to claim 14, wherein the plating solution contains copper sulfate.

16. The method according to claim 14, wherein the protection film is dissolved, while a potential is applied to the seed film so as not to dissolve the first metal in the plating solution, but as to dissolve the second metal and the oxide of the second metal in the plating solution.

17. The method according to claim 11, wherein the plating film is formed, with the protection film being completely removed.

18. The method according to claim 11, wherein the plating film is formed, with part of the protection film being left.

19. The method according to claim 11, wherein the protection film is formed, with a film thickness of the protection film being smaller inside the recessed portion than on a surface portion of the substrate outside the recessed portion.

20. The method according to claim 19, wherein the forming the alloy film comprises a first procedure forming the alloy film on the inner face of the recessed portion and on a surface portion of the substrate outside the recessed portion, and a second procedure further stacking the alloy film preferentially on the surface portion outside the recessed portion after the first procedure.

* * * * *